United States Patent [19]

Suzuki et al.

[11] 4,322,980
[45] Apr. 6, 1982

[54] SEMICONDUCTOR PRESSURE SENSOR HAVING PLURAL PRESSURE SENSITIVE DIAPHRAGMS AND METHOD

[75] Inventors: Seikou Suzuki, Hitachiota; Motohisa Nishihara; Kanji Kawakami, both of Katsuta; Hideo Sato, Hitachi; Shigeyuki Kobori, Hitachi; Hiroaki Hachino, Hitachi; Minoru Takahashi, Katsuta, all of Japan

[73] Assignee: Hitachi, Ltd., Tokyo, Japan

[21] Appl. No.: 170,663

[22] Filed: Nov. 8, 1979

[51] Int. Cl.³ .............................................. G01L 9/06
[52] U.S. Cl. ......................................... 73/727; 338/4
[58] Field of Search .............. 73/727, 726, 721, 720, 73/777; 338/4, 2, 42

[56] References Cited

U.S. PATENT DOCUMENTS

| | | | |
|---|---|---|---|
| 3,397,278 | 8/1968 | Pomerantz | 357/49 |
| 3,918,019 | 11/1975 | Nunn | 73/726 |
| 4,079,508 | 3/1978 | Nunn | 338/2 |
| 4,085,620 | 4/1978 | Tanaka | 73/727 |
| 4,121,334 | 10/1978 | Wallis | 338/4 |
| 4,129,042 | 12/1978 | Rosvoid | 73/727 |
| 4,168,630 | 9/1979 | Shirouzu | 73/727 |
| 4,222,277 | 9/1980 | Kurtz | 73/727 |

Primary Examiner—Donald O. Woodiel
Attorney, Agent, or Firm—Craig and Antonelli

[57] ABSTRACT

A semiconductor pressure sensor having plural pressure sensitive diaphragms and capable of producing electric signals of at least two pressures.

A semiconductor pressure sensor has a semiconductor single crystal chip (1) on which two diaphragms (12a, 12b) are shaped, pairs of strain gauges (13a and 14a, and 13b and 14b), each of which pairs are constructed on each pressure sensitive diaphragm, electrodes (15a and 16a, and 15b and 16b) which are provided for electrical connections of these strain gauges on the semiconductor single crystal, and an insulating substrate of borosilicate glass, the thermal expansion coefficient is substantially equal tol that of said semiconductor single-crystal chip, wherein the semiconductor single-crystal chip (1) and the glass substrate (2) are bonded to each other by an Anodic Bonding method, thereby being able to obtain a semiconductor pressure sensor which scarcely producing errors outputs.

19 Claims, 9 Drawing Figures

SEMICONDUCTOR PRESSURE SENSOR HAVING PLURAL PRESSURE SENSITIVE DIAPHRAGMS AND METHOD

BACKGROUND OF THE INVENTION

The present invention relates to a pressure sensor, particularly to a pressure sensor having plural pressure sensitive diaphrams and providing electric signals indicating at least two pressures as its outputs.

With the increase of social requests such as economy of fuel and/or purification of exhaust gas, various controls of an engine, for example controls of fuel injection, ignition timing and recirculation of exhaust gas, come to be electronically accomplished by utilizing a microcomputer. In such electronic controls, various kinds of pressure signals, for example signals respectively indicating absolute pressures of atmosphere and vacuum in a manifold of the engine and signal indicating relative pressure of the vacuum in the manifold to the atmospheric pressure, are necessary to be detected accurately, and various kinds of pressure sensors have been proposed.

Such pressure sensor for use in an automobile, however, must satisfy various requirements, as well as of the accuracy, of reliability and cost. Namely, a pressure sensor having high reliability, structure suitable for mass production and low cost is required.

For example, in Japanese Patent Publication No. 52-17437 (1977), a pressure transducer including a piece of single-crystal chip of semiconductor such as silicon, on which two pressure sensitive diaphragms are fabricated, is shown. In this pressure transducer, pressure to be detected is applied to one of these pressure sensitive diaphragms, and atmospheric pressure to the other thereof. On the backs of the pressure sensitive diaphragms, strain gauges are constructed, and a vacuum chamber or a chamber in which inactive gas is filled is provided thereon. And this pressure transducer provides only with an electric signal in proportion to the relative pressure of the gas to be detected to atmosphere.

Such pressure transducer, however, has following drawbacks. That is, because the semiconductor single-crystal chip is attached by bonding pads on a housing member which is composed of material such as iron having a coefficient of thermal expansion being greatly different from that of single silicon crystal, errors appear in the output of the pressure transducer. In the case that a chip of the single silicon crystal with the pressure sensitive diaphragm(s) is bonded on the housing of metal, as is well known in the art, strain appears in the pressure sensitive diaphragm depending on the change of ambient temperature because of the difference between the coefficients of the thermal expansions thereof, and therefore causes the errors.

Also, the variety of the two pressure sensitive diaphragms in their characteristics, contributes to the errors. That is, when the relative pressure is obtained by detecting two pressures different to each other, though it may be the same when the two pressures are respectively obtained, the uniformity of the characteristics of the pressure sensitive diaphragms are required in particular. If the semiconductor single-crystal chip is fixed on the metal housing by the bonding pads, it causes great difficulty to obtain two pressure sensitive diaphragms being very similar to each other in characteristics. Namely, it is very difficult to accomplish the fixation under the uniform bonding condition on the whole surface between the chip and the housing.

Further, the pressure transducer mentioned above is not suitable for the mass production in view of the structure thereof. Particularly, it is true in the structure of the electrodes which are provided for electrically connecting the strain gauges within the vacuum chamber to the outside.

Furthermore, the pressure transducer provides only with a signal indicating one pressure, i.e. the relative pressure of the gas to be detected with respect to atmosphere.

Other relevant prior art is as follows:

(1) U.S. Pat. Nos. 3,918,019 and 4,079,508, "MINIATURE ABSOLUTE PRESSURE TRANSDUCER ASSEMBLY AND METHOD"'s.

Although both of these patents teach a glass substrate and Anodic Bonding technique, there is no discription or teach concerning a semiconductor single-crystal chip having two pressure sensitive diaphrams.

(2) U.S. Pat. No. 3,397,278, "ANODIC BONDING".

This patent relates to the Anodic Bonding technique.

SUMMARY OF THE INVENTION

An object of the present invention, therefore, to provide a semiconductor pressure sensor having plural pressure sensitive diaphragms and scarcely producing errors.

Another object of the present invention is to provide a semiconductor pressure sensor having plural pressure sensitive diaphragms which are similar to one another in the characteristics.

Further, another object of the present invention is to provide a semiconductor pressure sensor which is able to produce at least two output signals of various pressures.

Furthermore, another object of the present invention is to provide a semiconductor pressure sensor free from the drawbacks of the conventional art mentioned above.

According to the present invention, the objects mentioned above is accomplished by a semiconductor pressure sensor comprising: a semiconductor single-crystal chip on which plural pressure sensitive diaphragms are fabricated; plural strain gauges and electrodes constructed on said semiconductor single-crystal chip; and an insulating substrate composed of material having a thermal expansion coefficient substantially equal to that of said semiconductor single-crystal, and shaping plural chambers together with the plural diaphragms of said semiconductor single-crystal chip, and characterized in that said semiconductor single-crystal chip and said insulating substrate are bonded to each other by anodic bonding method.

Other objects mentioned above are achieved by a semiconductor pressure sensor comprising: a semiconductor single-crystal chip on which plural pressure sensitive diaphragms are fabricated; plural strain gauges and electrodes constructed on the plural diaphragms of said semiconductor single-crystal chip, respectively; an insulating substrate composed of material having a thermal expansion coefficient substantially equal to that of said semiconductor single-crystal, and shaping plural chambers together with the plural diaphragms of said semiconductor single-crystal chip; and a detecting circuit for detecting the strain sensitive resistances of said strain gauges and producing plural electric signals indicating the strains of the diaphragms of said semiconductor single-crystal chip, respectively.

Further, other objects mentioned above are accomplished by a semiconductor pressure sensor comprising; a semiconductor single-crystal chip on which plural pressure sensitive diaphragms are fabricated; plural strain gauges and electrodes constructed on one surface of said semiconductor single-crystal chip; an insulating substrate composed of material having a thermal expansion coefficient substantially equal to that of the semiconductor single-crystal and attached on the other surface of said semiconductor single-crystal chip, thereby, shaping plural chambers together with the plural diaphragms thereof; and a covering member composed of material having a thermal expansion coefficient substantially equal to that of the semiconductor single-crystal and mounted on the one surface of said semiconductor single-crystal chip, thereby, shaping another chamber together with the diaphragms thereof, wherein electrical connection of said plural strain gauges within said covering member to the outside is achieved by means of plural openings formed on said covering member at the positions corresponding to the electrodes of said semiconductor single-crystal chip, or the electrodes formed on said semiconductor single-crystal chip expanding over said covering member.

These objects mentioned above and other objects and advantages of the present invention will become apparent from the following detailed description of preferred embodiments given by reference to the accompanying drawings.

DETAILED DESCRIPTION OF PREFERRED EMBODIMENTS

Figure 1:
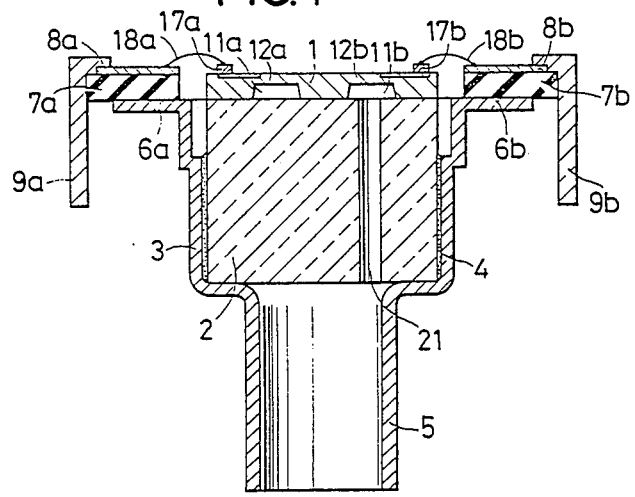
FIG. 1 is a cross-sectional view showing an embodiment of a semiconductor pressure sensor in accordance with the present invention.

Referring now to drawings, wherein like elements are designated by like reference numerals, particularly to FIG. 1, a semiconductor pressure sensor according to the present invention includes a single-crystal chip 1 of semiconductor such as silicon, and an insulating substrate 2 composed of material, the thermal expansion coefficient of which material is substantially equal to that of the semiconductor single-crystal. The insulating substrate 2 is inserted within a housing 3 composed of metal or plastic, and fixed by bonding pads 4 thereto. The lower part 5 of the housing 3 is shaped like a pipe, to which, for example, vacuum in a manifold of an engine is led through a rubber tube. On the upper part of the housing 3, there are provided spreading portions 6a and 6b, on which portions insulating members 7a and 7b of ceramics are fixed by the bonding pads. On each surface of the insulating members 7a and 7b, a pair of thick film conductors is formed by well-known method, such as Green Sheet method. In this cross-sectional view, only two thick film conductors 8a and 8b of those four thick film conductors, which are formed on respective insulating members 7a and 7b, are shown. Moreover, on the each surface of the insulating members 7a and 7b, a pair of terminals is fixedly attached at the edge thereof. And the four terminals are electrically connected to the four thick film conductors, respectively. In the cross-sectional view, there is shown also only two terminals of them by reference numerals 9a and 9b.

Figure 2A:
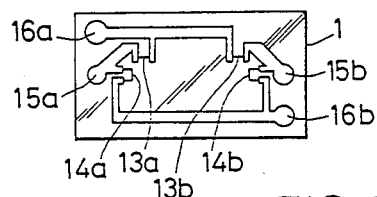
FIGS. 2(a) and 2(b) are a top plan view and a bottom plan view of a semiconductor single-crystal chip of the semiconductor pressure sensor shown in FIG. 1, respectively.
Figure 2B:
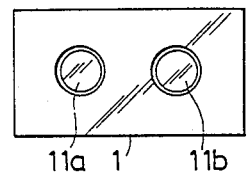

On the back of the single-crystal chip 1 of semiconductor such as silicon, as shown in FIG. 2(b), two cavities 11a and 11b are formed by a method such as etching, and shape two pressure sensitive diaphragms 12a and 12b, as well as two chambers together with the insulating substrate 2. On the surface of the single silicon crystal chip 1, as is shown in FIG. 2(a), respective semiconductor strain gauges are constructed in the regions of the pressure sensitive diphrams 12a and 12b by a method such as diffusion. According to the present invention, on the pressure sensitive diaphrams 12a and 12b, tangential gauges 13a and 13b are constructed in the tangential direction with respect to the crystallographic axis of the single silicon crystal chip 1, and radial gauges 14a and 14b in the radial direction with respect to the crystallographic axis thereof, respectively. Moreover, on the surface of the single silicon crystal chip 1, pattern electrodes 15a and 15b and 16a and 16b are formed by the diffusion method, through which electrodes the semiconductor gauges 13a and 13b and 14a and 14b are respectively connected to the four terminals mentioned above. Namely, turning to FIG. 1, on the pattern electrode 15a, for example, an electrode 17a which is composed of three layers of gold-palladium-titanium (Au-Pd-Ti), is provided. And the electrode 17a is electrically connected to the thick film conductor 8a on the insulating member 7a through a conductor line 18a, such as gold wire, which is bonded by well-known Wire Bonding method. The pattern electrode 15b is also electrically connected to the thick film conductor 8b through an electrode 17b and a gold wire 18b. The other pattern electrodes are connected to the respective thick film conductors in the same manner as mentioned above. The details of the circuitry of the semiconductor gauges and the pattern electrodes constructed on the single silicon crystal chip 1 will be given afterward. The electrodes 17a and 17b also can be constructed by evaporating aluminum.

The insulating substrate 2, for example, is made of borosilicate glass well-known as heatproof glass, which is available from Corning Glass Work under the trademark "Pyrex", preferably "Pyrex No. 7740". On this glass substrate 2, an opening hole 21 piercing from the back to the surface thereof is fabricated, through which hole the vacuum at the lower part 5 in shape of a pipe of the housing 3 is led to the chamber 11b. On the other hand, the chamber 11a is kept at vacuum, which will become apparent from the following description.

The single silicon crystal chip 1 and glass substrate 2, after being treated by respective predetermined processes, are bonded to each other by Anodic Bonding method. This Anodic Bonding is a technique for bonding semi- or conductor such as silicon and insulator such as glass without bonding pads, and the details thereof is shown, for example, in U.S. Pat. No. 3,397,278. The details in the present embodiment will be given hereinafter.

At the beginning, the single silicon crystal chip 1, on which the cavities 11a and 1b are formed, and the glass substrate 2, on which the opening hole 21 is formed, are piled up, and the positive pole and the negative pole, the former on the silicon side and the latter on the glass substrade side, are provided. Then, the piled single silicon crystal chip 1 and glass substrate 2 are placed in vacuum condition and heated to about 350° C. Between these poles, a voltage of 1000 (V) is applied for about thirty minutes. Thereby, the single silicon crystal chip 1 can be fixed on the glass substrate 2 under the uniform bonding condition on the whole surface therebetween.

The single silicon crystal chip 1 and glass substrate 2 bonded by the above-mentioned method are free from cracking due to thermal strain even if the ambient temperature decreases down to the room temperature after the bonding, because the thermal expansion coefficients thereof are equal to each other. Through the Anodic Bonding is not necessary to proceed under vacuum condition, the vacuum chamber 11a beteen the single silicon crystal chip 1 and the glass substrate 2 is obtained by conducting it under vacuum condition, advantageously. As is previously mentioned, the bonding surface obtained by the Anodic Bonding is excellent and uniform, and has good airtightness, thereby keeps the vacuum of the chamber 11a stable for a very long time.

Figure 3:
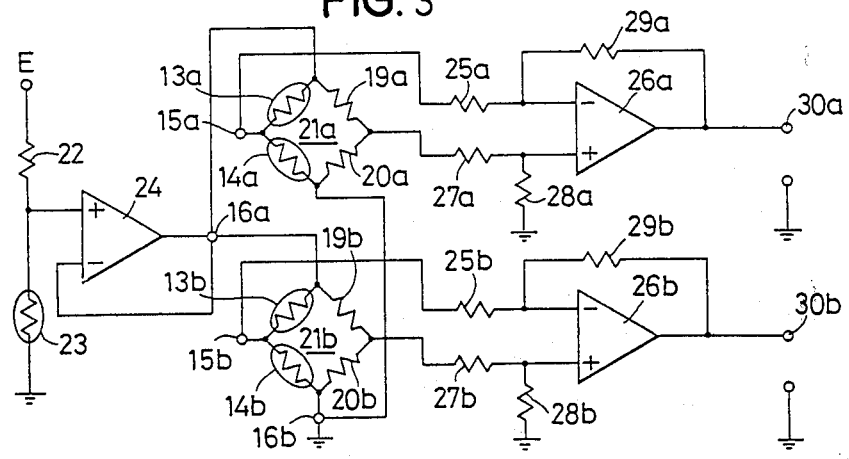
FIG. 3 is a schematic diagram showing a detecting circuit for detecting the strain sensitive resistances of gauges formed on two pressure sensitive diaphragms of the semiconductor pressure sensor shown in FIG. 1.

In FIG. 3, a detecting circuit is shown, which is provided for detecting the resistance variation of the semiconductor strain gauges 13a and 13b and 14a and 14b due to the strains on the pressure sensitive diaphragms 12a and 12b, and for producing two output signals, one of which signals is proportional to the absolute pressure of atmosphere and the other proportional to the relative pressure of the vacuum in the manifold to atmosphere. The tangential and radial gauges 13a and 14a on the pressure sensitive diaphragm 12a constructs a first bridge circuit 21a together with two resistors 19a and 20a, and the other tangential and radial gauges 13b and 14b a second bridge circuit 21b together with two resistors 19b and 20b. In this schematic diagram, the pattern electrodes 15a and 15b and 16a and 16b shown in FIG. 2(a) are also designated by like reference numerals. To input terminals of these first and second bridge circuits 21a and 21b, i.e. the pattern electrode 16a, excitation current is supplied from a excitation source which is constructed by a resistor 22, a thermistor 23 and an operational amplifier (OP amplifier) 24. These bridge circuits 21a and 21b are known as the active bridge circuit. As the excitation method, a constant voltage excitation method and a constant current excitation method are known, and the latter thereof is adopted in this embodiment. Namely, a source voltage E is applied across the series connection of the resistor 22 and the thermistor 23, and the voltage appearing across the thermistor 23 is applied to the non-inverting input of the OP amplifier 24. And the output of the OP amplifier 24 is fed back to the inverting input thereof. Therefore, the amplitude of the excitation current is controlled so that the span of the bridge circuit 21a or 21b is compensated for the variation of the ambient temperature.

One output terminal of the first bridge circuit 21a, i.e. the pattern electrode 15a, is connected to the inverting input of an OP amplifier 26a, and the other output terminal, i.e. the juncture between the resistors 19a and 20a, to the non-inverting input thereof. The non-inverting input of the OP amplifier 26a is also connected to ground through a resistor 28a, and the output thereof is fed through a resistor 29a back to the inverting input thereof. Therefore, an output voltage signal proportional to the strain of the pressure sensitive diaphram 12a, that is to the absolute pressure of atomosphere, is produced at an output terminal 30a. As is apparent from the figure, for the second bridge circuit 21b, another amplifier circuit is constructed in the same manner as mentioned above, and produces at an output terminal 30b another output voltage signal proportional to the strain of the pressure sensitive diaphram 12b, that is to the relative pressure of the vacuum in the manifold to atmosphere. This another amplifier circuit is similar to the one mentioned above in the construction, and the elements thereof are given like reference numberals distinguishing themselves from the corresponding elements by small letter "b" suffixed to the numerals.

Figure 4:
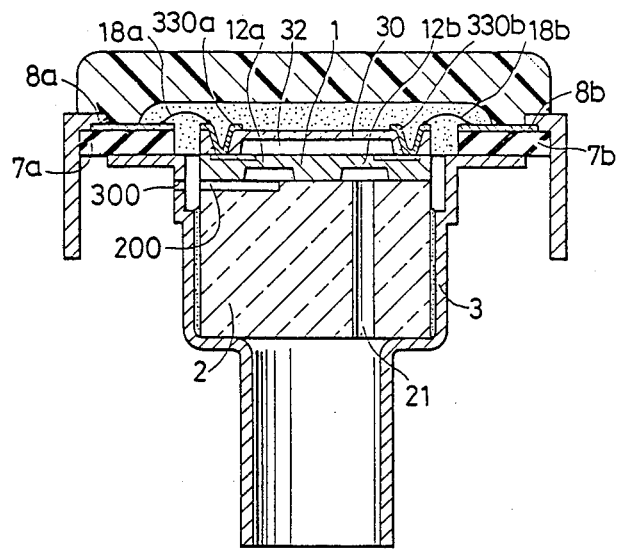
FIG. 4 is a cross-sectional view showing another embodiment of a semiconductor pressure sensor in accordance with the present invention.
Figure 5A:
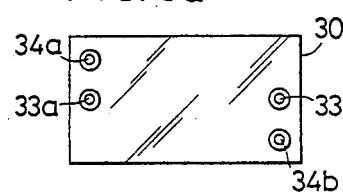
FIGS. 5(a) and 5(b) are a top plan view and a bottom plan view of a glass covering member of the semiconductor pressure sensor shown in FIG. 4.
Figure 5B:
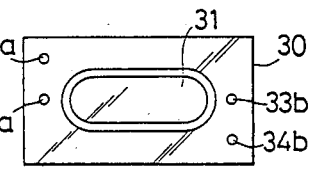

In FIG. 4, another embodiment is shown, in which a covering member 30 is further mounted on the single silicon crystal chip 1. This covering member 30, as well as the insulating substrate 2, is composed of the borosilicate glass. As is also shown in FIG. 5(a), a cavity 31 is formed on the back of the covering member 30 so as to environ the two pressure sensitive diaphragms 12a and 12b on the single silicon crystal chip 1, and to shape a chamber 32 together with the surface of the single silicon crystal chip 1. Further on the glass covering member 30, four piercing holes 33a and 33b and 34a and 34b are shaped at the corresponding positions where the four pattern electrodes are constructed on the single silicon crystal chip 1. The glass covering member 30 is bonded on the single silicon crystal chip 1 by the aforementioned Anodic Bonding, and the vacuum chamber 32 is formed therebetween.

On the surface of the glass substrate 2, a groove 200 is shaped further than the hole 21, and an opening 300 is formed on the side wall of the housing 3. Through the groove 200 and the opening 300, atmosphere is led to the chamber 12a formed between the single silicon crystal chip 1 and the glass substrate 2. Therefore, absolute pressures of atmosphere and the vacuum in the manifold are detected, respectively, in accordance with this embodiment.

Figure 6:
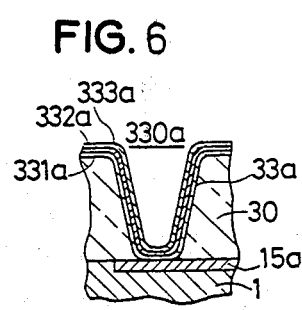
FIG. 6 is a partial cross-sectional view showing the details of electrodes formed on the glass covering member of the semiconductor pressure sensor shown in FIG. 4.

After the above-mentioned glass covering member 30 is bonded on the single silicon crystal chip 1 by the Anodic Bonding, four electrodes are constructed on the four hole 33a and 33b and 34a and 34b. Though only two electrodes 330a and 330b are shown in FIG. 4, these electrodes 330a and 330b, as well as the other electrodes not shown, are constructed as follows. As is shown in FIG. 6, for example, the hole 33a of the glass covering member 30 is positioned at the pattern electrode 15a, and three metal layers of gold (Au) 331a, palladium (Pd) 332a and titanium (Ti) 333a are formed in sequence on the hole 33a by a method such as evaporation. Another electrode constructed by evaporation of aluminum (Al) can substitute for the three layer electrode 330a mentioned above. And the electrodes 330a and 330b, as is clearly shown in FIG. 4, are electrically connected to the thick film conductors 8a and 8b on the insulating members 7a and 7b through the gold wires 18a and 18b bonded by well-known Wire Bonding method, respectively.

After the above-mentioned electrical connection is accomplished, a coat of silicon-gel 40 is provided, thereby, covering the glass covering member 30, the thick film conductors 8a and 8b and the gold wires 18a and 18b. Further, on the silicon-gel coat 40, a prastic mold 50 is mounted.

Figure 7:
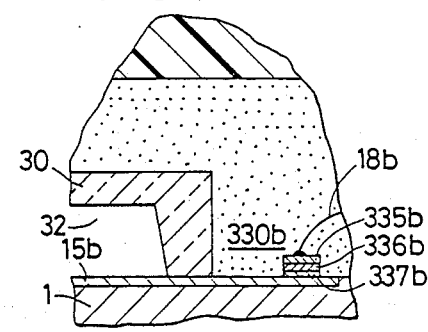
FIG. 7 is a partial cross-sectional view showing another electrode for electrically connecting the gauges within the glass covering member to the outside in the semiconductor pressure sensor shown in FIG. 4.

In FIG. 7, there is shown another construction of the pattern electrodes than the above mentioned. For example, the pattern electrode 15b which is constructed on the surface of the single silicon crystal chip 1, expands over the glass covering member 30, and the above-mentioned three layer electrode 330b of gold-palladium-titanium is constructed on the expanding portion thereof. On the three layer electrode 330b, the gold wire 18b bonded by the Wire bonding technique.

These two constructions of the electrodes mentioned above are suitable for the mass production because these electrodes can be easily constructed after the glass covering member 30 is bonded on the single silicon crystal chip 1.

While we have shown and described several embodiments in accordance with the present invention, it is understood that the same is not limited thereto but is susceptible of numerous changes and modifications as are obvious to those of ordinary skill in the art, and we therefore do not wish to be limited to the details described and shown herein but intend to cover all such changes and modifications as are obvious to those of skill in the art.

What is claimed is:

1. A semiconductor pressure sensor comprising:
a single-crystal semiconductor chip on which at least two pressure sensitive diaphragms are formed;
strain gauge means constructed on the respective diaphragms of said chip to produce output signals, one of the output signals being produced in response to an absolute pressure of atmosphere and the other output signals being produced in accordance with relative values of pressures to be measured with respect to the atmosphere;
electrodes provided on said chip for electrical connection of said strain gauge means; and
an insulating substrate having a thermal expansion coefficient substantially equal to that of said chip and attached to said chip by an anodic bonding method to form chambers together with the diaphragms of said chip, one of the chambers being maintained at vacuum and the pressures to be measured being led to the other chambers.

2. A semiconductor pressure sensor as claimed in claim 1, wherein said insulating substrate is composed of borosilicate glass.

3. A semiconductor pressure sensor as claimed in claim 1, wherein at least one opening is formed on said insulating substrate, at least one pressure being led to the corresponding chamber therethrough.

4. A semiconductor pressure sensor as claimed in claim 1, wherein said insulating substrate is attached on the surface of said semiconductor single-crystal chip opposite to the surface, on which said strain gauge means and said electrodes are formed.

5. A semiconductor pressure sensor as claimed in claim 1, wherein there is further provided means for detecting the resistance values of said strain guage means and producing the output signals, each of signals is proportional to the strain of the corresponding diaphragm of said semiconductor single-crystal chip.

6. A semiconductor pressure sensor comprising:
a single-crystal semiconductor chip on which at least two pressure sensitive diaphragms are formed;
strain gauge means constructed on the respective diaphragms of said chip to produce output signals, one of the output signals being produced in response to an absolute pressure of atmosphere and the other output signals being produced in accordance with relative values of pressures to be measured with respect to atmosphere;
electrodes provided on said chip for electrical connection of said strain gauge means;
an insulating substrate having a thermal expansion coefficient substantially equal to that of said chip and attached to said chip by an anodic bonding method to form chambers together with the diaphragms of said chip, one of the chambers having a pressure of atmosphere led thereto and the pressures to be measured being led to the other chambers; and
a covering member having a thermal expansion coefficient substantially equal to that of said chip and mounted on said chip to delimit another chamber together with said chip, the another chamber being maintained at vacuum.

7. A semiconductor pressure sensor as claimed in claim 6, wherein said covering member is composed of borosilicate glass.

8. A semiconductor pressure sensor as claimed in claim 6, wherein at least one groove is formed on said insulating substrate, at least one pressure being led to the corresponding chamber therethrough.

9. A semiconductor pressure sensor as claimed in claim 6, wherein said covering member is attached on the surface of said semiconductor single-crystal chip, on which surface said strain gauge means and said electrodes are formed.

10. A semiconductor pressure sensor as claimed in claim 6, wherein there is further provided means for detecting the resistance values of said strain gauge means and producing at least two electric signals, each of which signals is proportional to the strain of the corresponding diaphragm of said semiconductor single-crystal chip.

11. A semiconductor pressure sensor as claimed in claim 5 or 10, wherein two strain gauges are constructed on each diaphragm of said semiconductor single-crystal chip.

12. A semiconductor pressure sensor as claimed in claim 11, wherein said detecting and producing means comprises at least two pairs of series connected resistors, each of which pairs forms an active bridge circuit together with the corresponding pair of said strain gauges.

13. A semiconductor pressure sensor as claimed in claim 11, wherein said detecting and producing means further comprises at least two amplifier circuits for amplifying outputs appearing across the bridge circuits, respectively.

14. A semiconductor pressure sensor as claimed in claim 11, wherein there is further provided means for supplying the bridge circuits with exciting current, the amplitude of the exciting current being controlled depending on an ambient temperature.

15. A semiconductor pressure sensor as claimed in claim 14, wherein said exciting current supplying means includes a thermistor.

16. A semiconductor pressure sensor as claimed in claim 10, wherein plural openings are formed on said covering member at the positions corresponding to said electrodes formed on said semiconductor single-crystal chip, the electrical connection between said gauges within said covering member and said detecting means being achieved through the openings.

17. A semiconductor pressure sensor as claimed in claim 10, wherein said electrodes are formed on said semiconductor single-crystal chip expanding over said covering member, the electrical connection between said gauges within said covering member and said detecting means being achieved through the expanding portions of said electrodes.

18. A semiconductor pressure sensor as claimed in claim 1 or 6 wherein said anodic bonding method comprieses steps of:
piling up said semiconductor single-crystal chip and said insulating member;
attaching poles to said piled semiconductor single-crystal chip and said insulating member, respectively,
heating the piled semiconductor single-crystal chip and insulating material, and applying a predetermined voltage across the poles for a predetermined period.

19. A semiconductor pressure sensor comprising:
a single-crystal semiconductor chip on which at least two pressure sensitive diaphragms are formed;
strain gauge means constructed on the respective diaphragms of said chip to produce output signals, one of the output signals being produced in response to an absolute pressure of atmosphere and the other output signals being produced in accordance with relative values of pressures to be measured with respect to atmosphere;
a potential source means for exciting said strain gauge means, said source means having means for compensating an exciting voltage commonly to all of said strain gauge means in accordance with the variation of an ambient temperature; and
an insulating substrate having a thermal expansion coefficient substantially equal to that of said chip and attached to said chip by an anodic bonding method to form chambers together with the diaphragms of said chip, one of the chambers being utilized for detection of the absolute pressure of atmosphere and the other chambers being utilized to detect the pressures to be measured.

* * * * *